(12) United States Patent
Teunissen et al.

(10) Patent No.: US 7,265,364 B2
(45) Date of Patent: Sep. 4, 2007

(54) LEVEL SENSOR FOR LITHOGRAPHIC APPARATUS

(75) Inventors: Paulus Antonius Andreas Teunissen, Eindhoven (NL); Rene Marinus Gerardus Johan Queens, Eindhoven (NL); Petra Albertina Margaretha Dekkers-Rog, Eindhoven (NL); Alexander Charles Franciscus Anna Van Well, Best (NL)

(73) Assignee: ASML Netherlands B.V. (NL)

( * ) Notice: Subject to any disclaimer, the term of this patent is extended or adjusted under 35 U.S.C. 154(b) by 229 days.

(21) Appl. No.: 10/864,800

(22) Filed: Jun. 10, 2004

(65) Prior Publication Data

US 2005/0274909 A1    Dec. 15, 2005

(51) Int. Cl.
G03B 27/54 (2006.01)
G03B 27/52 (2006.01)
G01N 21/88 (2006.01)

(52) U.S. Cl. .............................. 250/491.1; 250/492.1; 250/492.2; 250/559.29; 250/339.01; 250/339.06; 356/364; 356/399; 356/400; 356/416

(58) Field of Classification Search .............. 250/491.1
See application file for complete search history.

(56) References Cited

U.S. PATENT DOCUMENTS

| | | | | |
|---|---|---|---|---|
| 4,834,530 A | * | 5/1989 | Murai et al. | 356/2 |
| 5,801,832 A | * | 9/1998 | Van Den Brink | 356/500 |
| 5,813,000 A | * | 9/1998 | Furlani | 707/3 |
| 6,323,952 B1 | * | 11/2001 | Yomoto et al. | 356/600 |
| 6,597,006 B1 | * | 7/2003 | McCord et al. | 250/559.19 |
| 6,674,510 B1 | * | 1/2004 | Jasper et al. | 355/55 |
| 6,730,920 B2 | * | 5/2004 | Groeneveld et al. | 250/491.1 |
| 6,757,056 B1 | * | 6/2004 | Meeks et al. | 356/73 |
| 6,906,785 B2 | * | 6/2005 | Queens et al. | 355/53 |
| 6,924,884 B2 | * | 8/2005 | Boonman et al. | 355/55 |
| 6,955,074 B2 | * | 10/2005 | Levasier et al. | 73/1.81 |
| 6,987,555 B2 | * | 1/2006 | Teunissen et al. | 355/53 |
| 2002/0018207 A1 | * | 2/2002 | Ina et al. | 356/400 |
| 2002/0051564 A1 | * | 5/2002 | Benesch et al. | 382/145 |
| 2002/0158185 A1 | * | 10/2002 | Nelson et al. | 250/201.2 |
| 2002/0186368 A1 | * | 12/2002 | Rosengaus et al. | 356/237.2 |
| 2003/0030817 A1 | * | 2/2003 | Lee et al. | 356/491 |
| 2003/0218141 A1 | * | 11/2003 | Queens et al. | 250/492.1 |
| 2004/0032581 A1 | * | 2/2004 | Nikoonahad et al. | 356/237.2 |
| 2004/0080737 A1 | * | 4/2004 | Jasper et al. | 355/55 |
| 2004/0165169 A1 | * | 8/2004 | Teunissen et al. | 355/67 |
| 2004/0169850 A1 | * | 9/2004 | Meeks | 356/237.2 |
| 2004/0184018 A1 | * | 9/2004 | Groeneveld et al. | 355/53 |
| 2004/0263846 A1 | * | 12/2004 | Kwan | 356/399 |
| 2005/0030507 A1 | * | 2/2005 | Teunissen et al. | 355/55 |
| 2005/0134816 A1 | * | 6/2005 | Modderman et al. | 355/53 |
| 2005/0274909 A1 | * | 12/2005 | Teunissen et al. | 250/491.1 |

* cited by examiner

Primary Examiner—Robert Kim
Assistant Examiner—Bernard Souw
(74) Attorney, Agent, or Firm—Pillsbury Winthrop Shaw Pittman LLP (57) ABSTRACT

A level sensor for a lithographic projection apparatus includes a light source configured to direct light onto a substrate to be measured, a detector configured to detect light reflected from the substrate, and a processor configured to calculate a difference between measurements made with the filter in the first configuration and in the second configuration. The sensor is adjustable between a first configuration, in which the light is given a first property, and a second configuration, in which the light is given a second property. The sensor may include a polarizing filter, such that the first and second properties are different polarization states.

34 Claims, 3 Drawing Sheets

LEVEL SENSOR FOR LITHOGRAPHIC APPARATUS

FIELD OF THE INVENTION

The present invention relates to lithographic apparatus and methods.

BACKGROUND

A lithographic apparatus is a machine that applies a desired pattern onto a target portion of a substrate. Lithographic apparatus can be used, for example, in the manufacture of integrated circuits (ICs). In that circumstance, a patterning structure, which is alternatively referred to as a mask or a reticle, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the projection beam in a given direction (the "scanning"-direction) while synchronously scanning the substrate parallel or anti-parallel to this direction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning structure" used herein should be broadly interpreted as referring to a structure that can be used to impart a beam of radiation with a pattern in its cross-section such as to create a pattern in a target portion of the substrate. It should be noted that the pattern imparted to the beam of radiation may not exactly correspond to the desired pattern in the target portion of the substrate. Generally, the pattern imparted to the beam of radiation will correspond to a particular functional layer in a device being created in the target portion, such as an integrated circuit.

A patterning structure may be transmissive or reflective. Examples of patterning structures include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e. bears the weight of, the patterning structure. It holds the patterning structure in a way depending on the orientation of the patterning structure, the design of the lithographic apparatus, and other conditions, such as for example whether or not the patterning structure is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning structure is at a desired position, for example, with respect to the projection system. Any use of the terms "reticle" or "mask" herein may be considered synonymous with the more general term "patterning structure".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques can be used to increase the numerical aperture of projection systems.

The term 'light' as used herein is not limited to electromagnetic radiation in the visible spectrum, but is intended to cover electromagnetic radiation of any suitable wavelength.

The pattern is imaged onto the target portion of the substrate using a lens known as a projection lens. When imaging the pattern onto the substrate it is desirable to ensure that an uppermost surface of the substrate (i.e. the surface onto which the pattern is to be imaged) lies within the focal plane of the projection lens. A level sensor may be used to determine the position of the uppermost surface of the substrate. If the level sensor indicates that the uppermost surface of the substrate does not lie in the focal plane of the projection lens, the height of a substrate table bearing the substrate may be adjusted accordingly.

The level sensor may also be used to measure any slope that may be present in the surface of the substrate, the substrate table being tilted accordingly to correct the slope.

The level sensor may be a valuable part of a lithographic projection apparatus. As the wavelengths used by lithographic apparatus become shorter, the focus depth of the projection lens reduces, and the accuracy of the level sensor may become increasingly important.

Level sensors used for lithographic projection apparatus may be subject to process dependency. Process dependency is a form of error in which level sensor measurements provide differing results depending on how a substrate being measured has previously been processed. For example, a level sensor may provide a particular height measurement for a wafer including a silicon substrate coated with a single layer of resist, and may provide a different height measurement for a wafer including a silicon substrate coated with several layers of resist, even if both wafers are at the same actual height. One error caused by process dependency is referred to as process dependent apparent surface depression, and is understood to be caused by an optical effect known as the Goos-Haenchen shift [ref: F. Goos and H. Haenchen, Ann. Phys. 1 (6), 333 (1947)]. The Goos-Haenchen shift is a lateral translation of light along a reflecting surface (in this case the resist) during reflection. The shift is dependent upon the material and layer structure of the substrate. As a result of process dependency, a substrate may not be correctly located in the focal plane of the projection lens. When this occurs, the resolution of a pattern imaged onto the substrate may be compromised.

SUMMARY

Embodiments of the invention include a level sensor for a lithographic projection apparatus, the level sensor including a light source configured to direct light onto a substrate to be measured, a detector configured to detect light reflected from the substrate, and a processor configured to calculate a difference between measurements made with the light having a first property and measurements made with the light having a second property different than the first property. The level sensor is adjustable between a first configuration in which the light is given the first property and a second configuration in which the light is given the second property, In some such embodiments, the sensor includes a polarizer, the first configuration of the polarizer applying an S-polarization to the light and the second configuration of the polarizer applying a P-polarization to the light. The polarizer may be a transmissive plate or may be a polarizing optical fibre.

In an embodiment of the invention, the filter may be a spectral filter.

In another embodiment of the invention, there is provided a lithographic projection apparatus including a radiation system configured to provide a beam of radiation; a support structure configured to support a patterning structure, the patterning structure serving to pattern the beam of radiation according to a desired pattern; a substrate table configured to hold a substrate; and a projection system configured to project the patterned beam onto a target portion of the substrate. The lithographic projection apparatus further includes a level sensor including a light source configured to direct light onto the substrate, a detector configured to detect light reflected from the substrate, and a filter adjustable between a first configuration in which a the light is given a first property and a second configuration in which the light is given a second property. The lithographic projection apparatus further includes a processor configured to calculate a difference between measurements made with the filter in the first configuration and the second configuration.

In yet another embodiment of the invention, there is provided a method of monitoring the performance of an optical level sensor, the method including directing a beam of light at a substrate and detecting a position of the beam of light when it is reflected from the substrate. The method includes measuring the height of the substrate based on the detecting. The method further includes filtering the light prior to the detecting, wherein the measuring includes measuring a height of the substrate with the filter in a first configuration and subsequently measuring a height of the substrate with the filter in a second configuration. The method also includes determining a difference between the measured heights.

In yet another embodiment of the invention, there is provided a level sensor including a light source configured to provide a light beam onto a surface of a substrate; a detector configured to detect a reflection of the light beam from the surface of the substrate; and a processor configured to determine a position of the substrate on the basis of at least a first detection of a reflection of the light beam from the surface of the substrate and a second detection of a reflection of the light beam from the surface of the substrate, wherein a polarization of the light beam in the first detection differs from a polarization of the light beam in the second detection.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
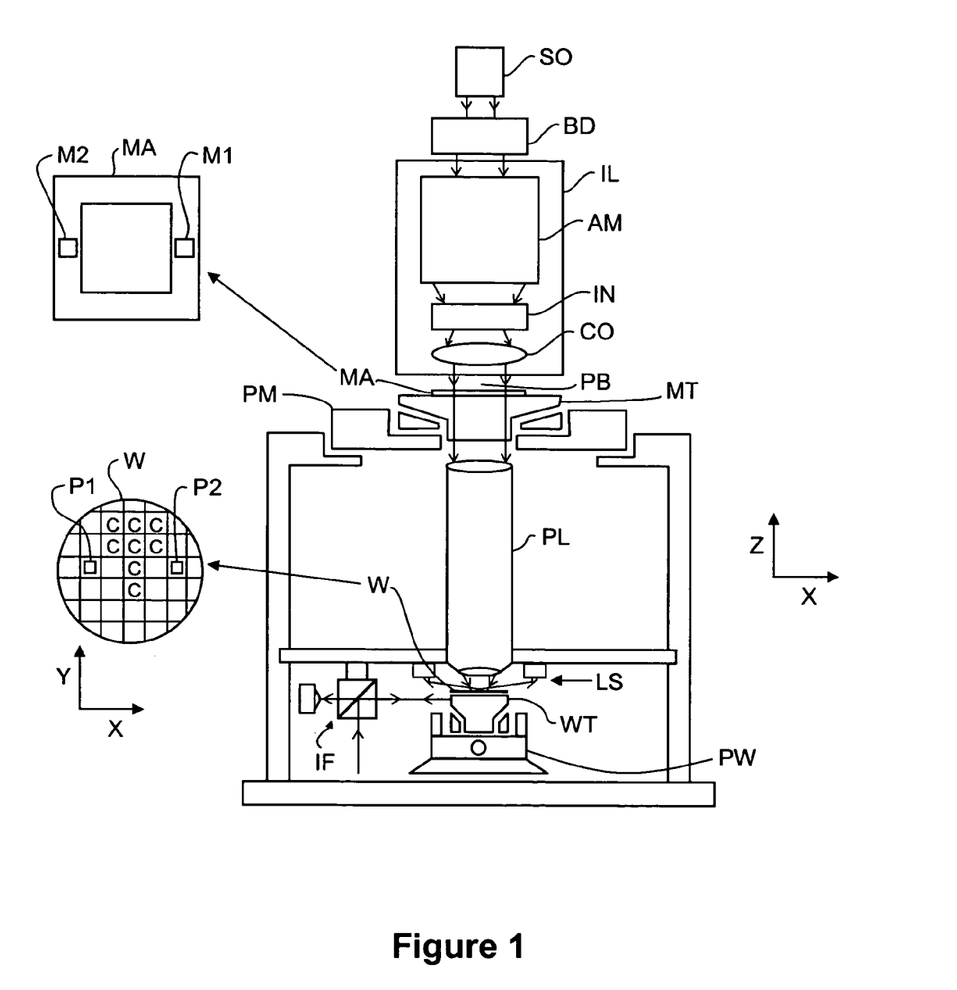
FIG. 1 depicts schematically a lithographic projection apparatus including a level sensor according to an embodiment of the invention.

FIG. 1 schematically depicts a lithographic apparatus according to an embodiment of the invention. The apparatus includes an illumination system (illuminator) IL configured to provide a beam PB of radiation (e.g. UV radiation) and a first support structure (e.g. a mask table) MT configured to support a patterning structure (e.g. a mask) MA and connected to first positioning device PM configured to accurately position the patterning structure with respect to a projection system ("lens"), item PL. The apparatus further includes a substrate table (e.g. a substrate table) WT configured to hold a substrate (e.g. a resist-coated wafer) W and connected to a second positioning device PW configured to accurately position the substrate with respect to the projection system ("lens"), item PL, the projection system (e.g. a refractive projection lens) ("lens") PL being configured to image a pattern imparted to the beam PB by a patterning structure MA onto a target portion C (e.g. including one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may include an adjusting structure AM configured to adjust the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally includes various other components, such as an integrator IN and a condenser CO. The illuminator provides a conditioned beam of radiation, referred to as the beam of radiation PB, having a desired uniformity and intensity distribution in its cross-section.

The beam PB is incident on the mask MA, which is held on the mask table MT. Having traversed the mask MA, the beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the beam of radiation is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the beam of radiation is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning structure, and the substrate table WT is moved or scanned while a pattern imparted to the beam of radiation is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structures, such as a programmable mirror array of a type as referred to above.

Combinations and/or variations on the above described modes of use or entirely different modes of use may also be employed.

In an embodiment of the invention, a level sensor, generally indicated as LS in FIG. 1, is used to measure the height and slope of the uppermost surface of the substrate W. The substrate table WT is raised or lowered, and tilted, accordingly to ensure that the uppermost surface of the substrate W is located in the focal plane of the projection lens PL.

Figure 2:
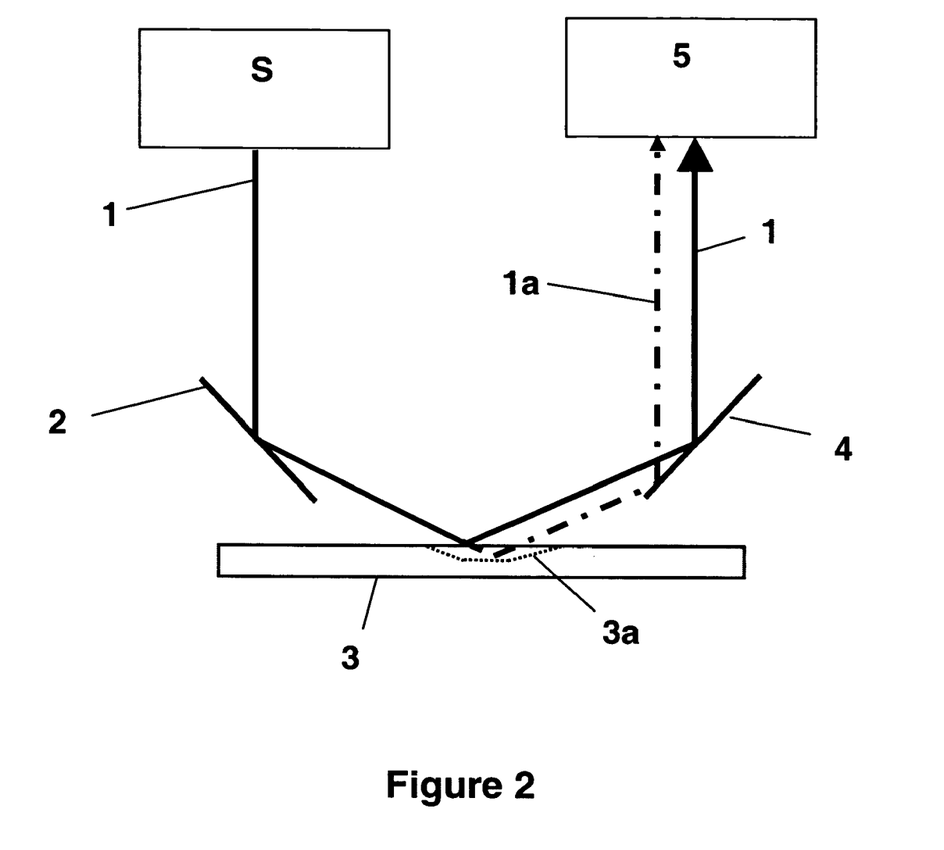
FIG. 2 depicts schematically a level sensor and illustrates apparent surface depression.

FIG. 2 illustrates schematically a level sensor according to an embodiment of the invention. A beam of light 1 generated by a suitable source S is directed via a folding mirror 2 to a substrate 3. The beam of light 1 is reflected from the surface of the substrate and is directed via a second folding mirror 4 to a detector 5.

A change of height of the surface of the substrate 3 is seen as a displacement of the location at which the beam of light 1 is incident upon the detector 5. For example, if the surface of the substrate is flat then the beam of light 1 is incident upon the centre of the detector 5 in this example. If the surface of the substrate includes an indentation, shown by dotted line 3a, then the point at which the beam of light is reflected is displaced, as shown by broken line 1a. An associated translation of the beam of light 1a occurs at the detector 5, indicating that the height of the surface of the substrate has changed. The height of the surface of the substrate 3 may thus be closely monitored by the level sensor.

Process dependency occurs because the reflection of the beam of light 1 from the surface is not a simple reflection. For example, the beam of light 1 may not be entirely directly reflected from the upper surface of the substrate 3, but instead a portion of the beam of light 1 may be translated along the surface of the substrate 3 for a short distance before being reflected (this is known as the Goos-Haenchen shift). This effect may give rise to apparent surface depression, a type of process dependency. Typically, the distance of translation is of the order of one wavelength of the beam of light.

If the distance of the translation were consistent, then it would be possible to calibrate the level sensor to account for the apparent surface depression. However, it has been found that the apparent surface depression has a strong dependency upon the structure of the surface of the substrate. For example, a silicon wafer coated with photo-resist of a certain thickness and optical density may give rise to a particular apparent surface depression, whereas a substrate including a silicon wafer coated with a photo-resist of another thickness and/or optical density may give rise to an entirely different apparent surface depression. A substrate comprising a silicon wafer coated with several layers of resist can give rise to a further entirely different apparent surface depression.

It is conventional to reduce process dependency of the level sensor by ensuring that the beam of light 1 has a broad wavelength band and has a variety of polarizations. However, while it is possible to reduce process dependency in this way, it may not be eliminated entirely. A complication associated with process dependency (for example, apparent surface depression) is that it may be difficult, using current known level sensors, to determine whether or not a measurement made by the level sensor suffers from process dependency. Typically, process dependency is only discovered after a lengthy analysis of processed substrates exposed by a given machine is performed. This may be a difficult and expensive undertaking. Since process dependency varies from lithographic process to lithographic process, and from lithographic apparatus to lithographic apparatus, it may be desirable to repeat the analysis for each lithographic process and each lithographic apparatus, leading to considerable expense.

The inventors have shown that when process dependency is present, there is a marked difference between the size of the process dependency of the level sensor for S-polarized and P-polarized light. Intuitively, it might be expected that both S-polarized and P-polarized light would have the same process dependencies.

Figure 3:
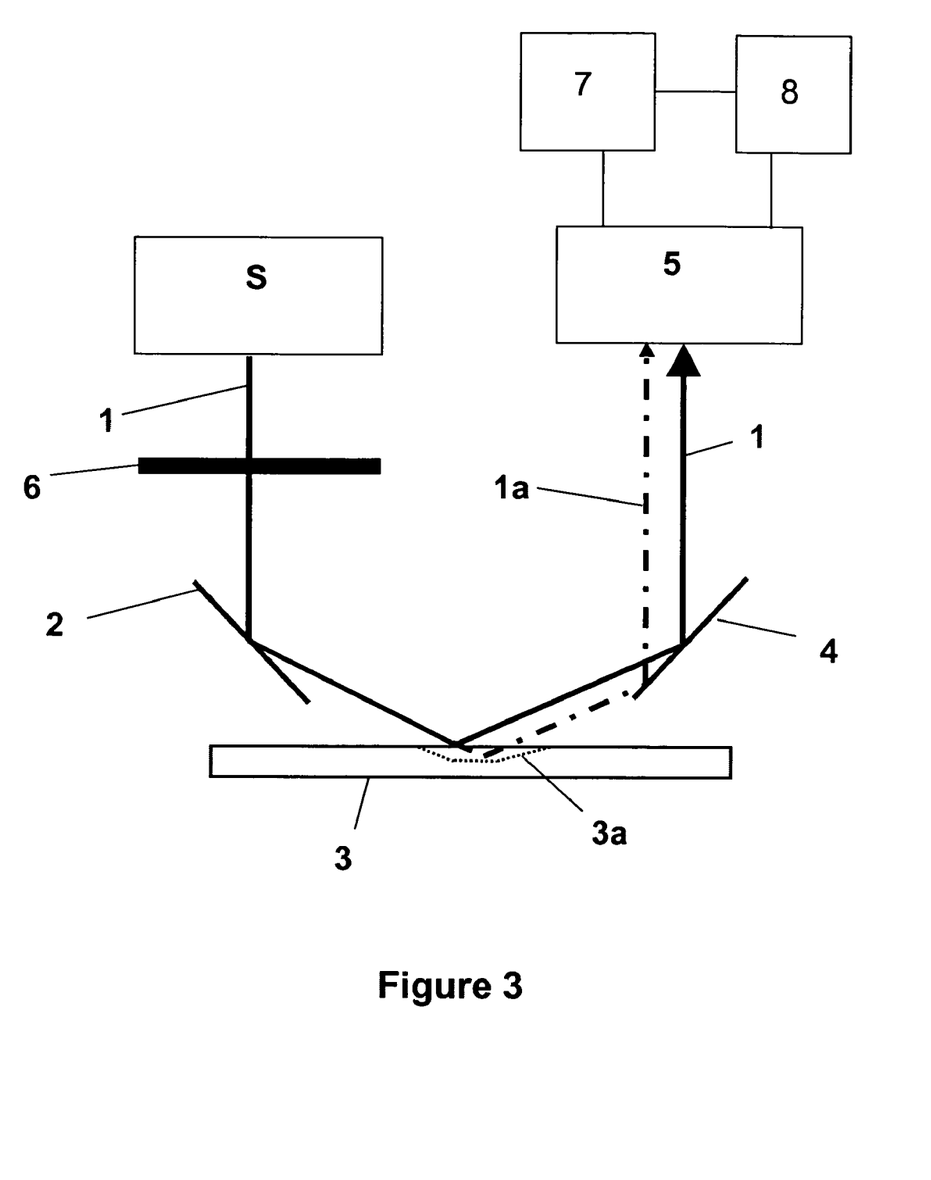
FIG. 3 depicts schematically a level sensor according to an embodiment of the invention.

A level sensor according to an embodiment of the invention is shown in FIG. 3. Referring to FIG. 3, the level sensor is provided with a polarizer 6. In an embodiment of the invention, the polarizer 6 can be a transmissive plate of conventional design, and can be rotated from a first configuration which transmits only S-polarized light to a second configuration which transmits only P-polarised light. In an alternative embodiment of the invention (not illustrated) the polarizer 6 can be implemented as a rotatably mounted polarizing beam splitter. The beam splitter can be rotated from a first configuration which transmits only S-polarized light to a second configuration which transmits only P-polarized light. The polarizer may be implemented using other suitable polarizing apparatus in other embodiments of the invention.

Selection of the polarization may be performed automatically, for example, via automated rotation of the polarizer 6 or polarizing beam splitter.

In an embodiment of the invention, the polarizer 6 is provided with a window containing no polarizing material. When a non-polarized level sensor measurement is required, the polarizer 6 is rotated to a third configuration which allows the beam of light 1 to pass without modifying its polarization. In an alternative arrangement, the polarizer 6 may be mounted such that it can be entirely removed from the path of the beam of light 1. Similar arrangements, or other suitable arrangements, may be used for the polarizing beam splitter to allow the beam of light 1 to pass unpolarized to the substrate 3.

In an embodiment of the invention, the level sensor, or alternatively the lithographic projection apparatus in which the level sensor is located, may be provided with a memory 7 configured to record height measurements. The level sensor (or lithographic projection apparatus) may also be provided with a processor 8 configured to determine a difference between height measurements or other relations between height measurements. The processor 8 may include a computer processor running appropriate software, or may include hardware configured to perform equivalent operations.

In an embodiment of the invention, for a given processed substrate, the presence (or otherwise) of process dependency, for example, apparent surface depression, may be found by mapping the height of the surface of the substrate with the level sensor using S-polarized light, then mapping the height of the surface of the substrate with the level sensor using P-polarized light, then determining the difference between the two maps. The manner in which the height maps are made and recorded may be conventional, except for the use of the S and P polarized light.

The resulting difference map may be used to provide a qualitative indication of the presence of process dependent apparent surface depression for that substrate.

In an embodiment of the invention, the presence (or otherwise) of process dependency may be found for a single die of a substrate, using a method which is equivalent to that described above in relation to the entire substrate. The signal-to-noise ratio of this die-based measurement may be improved by repeating the measurement for several dies, and averaging the results.

In another embodiment of the invention, the presence (or otherwise) of process dependency may be determined without using mapping, but instead by performing an on-the-fly measurement. This may be done by making a height measurement using S-polarized light, making a height measurement using P-polarized light, and comparing the result, the measurements being performed on the fly during exposure of a substrate. In an embodiment of the invention, the measurements can be performed simultaneously using two level sensors, one with P-polarized light and one with S-polarized light, a difference signal being used to determine whether process dependency is present.

The die based method was used to determine whether or not process dependency was present for a series of layers of a substrate, as shown below in Table 1:

TABLE 1

Comparison of Process dependent step as measured by a polarized level sensor and by an off-line measurement.

| Top Layer | Largest Topology Step Measured using Profileometer (arbitrary units) | Largest Process Dependent Step caused by Level Sensor (arbitrary units) | Largest Process Dependent Step Measured using an embodiment of the Invention (arbitrary units) |
|---|---|---|---|
| Contact 1 | 0.05 | 0.5 | 0.3 |
| Trench etch with oxide fill over nitride | 0.0 | 0.0 | 0.0 |
| Nitride on oxide | 0.0 | 0.0 | 0.0 |
| Metal 5 | 0.3 | 0.0 | 0.0 |
| Trench etch with oxide fill over nitride | 0.3 | 0.3 | 0.4 |
| Poly on oxide | 0.0 | 0.0 | 0.0 |
| Nitride on oxide | 1.5 | 0.0 | 0.0 |
| Contact 5 | 0.3 | 0.6 | 0.4 |
| Metal 1 | 0.15 | 0.05 | 0.0 |

Referring to Table 1, the first layer to be applied to the substrate is at the top of the table, i.e. Contact 1. A die height map was determined using a conventional level sensor (i.e. without a polarizer), by mapping the heights of several dies and determining the average height map. Die height maps were then determined using the embodiment of the invention, for S-polarized light and P-polarized light, by mapping and averaging the heights of several dies for each polarization. A difference die height map was determined by subtracting the S-polarization height map from the P-polarization height map. The substrate was then removed from the lithographic projection apparatus, and a die height map was determined using a Tencor P12 profileometer (a proprietary apparatus made by KLA-Tencor of San Jose, Calif., USA). The profileometer measured a die height map for several dies (e.g. 4 or 5) by passing a needle over the surface of the dies, and calculated an average die height map. Since the profileometer measurement is mechanical rather than optical, it does not suffer from apparent surface depression and can be used to provide a 'reference' for the measurement performed using the embodiment of the invention.

Referring to table 1, the topology steps measured by the profileometer are listed in the first column. The difference between the average die height map as measured by the level sensor and the average die height map measured by the profileometer was determined. This difference is the process dependency of the level sensor, and appears to be caused by apparent surface depression. For each layer, the maximum value of the apparent surface depression was found, and this is listed in the second column of table 1. The final column of table 1 shows the maximum difference value found between the average die maps for S-polarization and P-polarization, i.e. using an embodiment of the invention.

The profileometer measured the largest step in the topology of the die for the first layer on the substrate to be 0.05 units. The profileometer die height map and the conventional level sensor die height map were compared, and the conventional level sensor was found to have a maximum apparent surface depression of 0.5 units. The difference die height map determined using the embodiment of the invention was found to be 0.3 units.

For the second layer on the substrate no apparent surface depression was seen for the conventional level sensor. Similarly, the difference die height map determined using the embodiment of the invention gave a zero result. The same result was found for the next two layers, including Metal 5 which had a significant topology step of 0.3 units.

The fifth layer of the substrate, trench etch with oxide fill over nitride, gave an apparent surface depression of 0.3 units when comparing the conventional level sensor with the profileometer. The difference die height map determined using the embodiment of the invention was found to be 0.4 units.

For the remainder of the layers of the substrate, the presence of a significant apparent surface depression seen by the level sensor is indicated by a significant difference height map, determined using the embodiment of the invention (in this case, significant is intended to mean greater than 0.05 units).

It is clear from the results in Table 1 that this embodiment of the invention may be used to qualitatively indicate whether a measurement by a conventional level sensor will suffer process dependency, most likely from apparent surface depression. It will be appreciated that the presence or absence of process dependency can be determined for a layer of a substrate without requiring time consuming and expensive off-line measurement.

It will also be appreciated that the measurements provided by a sensor according to an embodiment of the invention may be spatially very accurately located. In other words, each measured point of the die difference height map may correspond accurately with a location on the die. For example, applications of such embodiments include making the S-polarization and P-polarization measurements inside a lithographic projection apparatus, which may provide accurate location information. The accuracy of location information provided by off-line tools is in contrast often poor, with the result that a comparison between a level sensor die height map and a die height map measured using a level sensor according to an embodiment of the invention may provide a low resolution result.

It will be appreciated that problems that arise due to substrate unflatness when using off-line measurement tools may be avoided with a sensor according to an embodiment of the present invention. For example, a substrate table used to hold a substrate in a profileometer may have a different topology than the substrate table WT of the lithographic projection apparatus, and this difference in topology may be wrongly measured as distortion of the substrate. In addition, one of the substrate tables may be contaminated, for example by a dust particle, leading to erroneous readings. Embodiments of the invention may be applied to allow the substrate to remain on the substrate table WT during measurement of the S-polarization and P-polarization, so that any deformation caused for example by the substrate table WT is cancelled out by the measurements.

In an embodiment of the invention, the level sensor is configured to provide measurement of global effects, for example global height offset. Global height offset is intended to mean that the height measurement of the level sensor is shifted (e.g. downwards) for all locations on a substrate (e.g. due to process dependency). A level sensor according to such an embodiment may be configured to measure this offset, whereas a conventional off-line measurement is not. One problem with attempting to measure the global height offset using the conventional off-line measurement is that the act of transferring the substrate to the substrate table of the off-line measurement tool may introduce a height shift, and it may be difficult for the tool to differentiate between this shift and the global height offset of the level sensor measurement. Being able to measure the global height offset is useful because, e.g., it may allow a user of a lithography machine to see directly whether processes applied to substrates (for example chemical mechanical polishing (CMP)) can be improved. In other embodiments of the invention, the level sensor may also be used to measure global tilt, another measurement that cannot be performed by an off-line measurement tool.

In another embodiment of the invention, instead of S-polarized and P-polarized light being used, S-polarized light and unpolarized light, or P-polarized light and unpolarized light, are used. Provided that process dependency leads to a difference in the signals detected by the level sensor, any combination of polarizations can be used (for example two different elliptical polarizations). Polarization selection may be via rotation of a polarizing filter, or by introduction and removal of a polarizing filter, or by introducing a first polarizing filter then swapping it for a second polarizing filter.

In an alternative embodiment of the invention, a wavelength filter is used in place of the polarizer 6. The wavelength filter may include, for example, two filters arranged to pass light of different wavelengths. An average die height map is measured for the first wavelength and is measured for the second wavelength. The difference between the measured die height maps is determined. The presence of a significant difference indicates the presence of process dependency in the measurement performed by the conventional level sensor.

The wavelength filter may be arranged, for example, to transmit 533 nm light when it is in a first configuration, and 900 nm light when it is in a second configuration.

In an alternative configuration, the wavelength filter may be formed from band-pass filters, or high-pass and low-pass filters.

In an embodiment of the invention, the wavelength filter may be provided with a window containing no filter. When a non-filtered level sensor measurement is required, the wavelength filter is rotated to a third configuration which allows the beam of light 1 to pass without modifying its wavelength. In an alternative arrangement, the wavelength filter may be mounted such that it can be entirely removed from the path of the beam of light 1. In further embodiments, one or more different polarizations of one or more different wavelengths may also be used.

In a further alternative embodiment of the invention, the source S is replaced or supplemented by a pair of sources (not shown in FIG. 3) which emit light at different wavelengths. The sources may be arranged to generate collinear beams of light, and may be used consecutively. As with the wavelength filter embodiment of the invention, an average die height map may be measured for the first wavelength and may be measured for the second wavelength. The difference between the average height maps is then determined. Such a source S may be used to obtain conventional level sensor measurements.

A substrate height map may be determined instead of, or in addition to, the die height map. An on-the-fly measurement, without mapping, may also be used.

Although the polarizing filter and the wavelength filter have been described as being between the source S and the substrate 3, it will be appreciated that they may be at any suitable position between the source S and the detector 5.

The information regarding the presence (or otherwise) of process dependency, which has been obtained using an embodiment of the invention, may be used in several ways. It can be used to determine when significant process dependency is present, for example, by comparison with a threshold, thereby indicating the need for calibration (or other correction) of the level sensor. The information can be used to identify specific regions where changes of the process dependency occur. For example, a die including two regions having different patterns may have a different process dependency for each pattern, a step in process dependency occurring at the interface of the patterns. The presence of such a step can be identified using an embodiment of the invention; such information may be useful e.g. for diagnostic purposes.

In an embodiment of the invention, the level sensor may be configured to determine if there is an area of a die that has substantial process dependency compared with other areas of the die. If such an area is found, the level sensor may be configured such that leveling data is not obtained from that area of the die, or such that leveling data obtained from that area of the die is not used during leveling (data from adjacent areas being interpolated instead).

In another embodiment of the invention, the lithographic apparatus may include an air-gauge which is used from time to time to monitor the process dependency of the level sensor. Embodiments of the invention may be used to determine which areas of a substrate (or die) should be measured using the air-gauge. It will be appreciated that, in applications of embodiments of the present invention, the need for the air-gauge to measure the entire substrate (or die) can be avoided, thereby reducing the time needed for the air-gauge measurement (air-gauge measurements are generally slow). Similarly, if a large amount of process dependency is indicated by a level sensor according to an embodiment of the invention for a substrate (or die), then the air-gauge may be used to perform more measurements than if a small amount of process dependency is indicated. Alternatively or additionally, one or more other sensors (e.g. process independent sensors) may be used.

While specific embodiments of the invention have been described above, it will be appreciated that the invention may be practiced otherwise than as described. Embodiments of the invention also include computer programs (e.g. one or more sets or sequences of instructions) to control a lithographic apparatus to perform a method as described herein, and storage media (e.g. disks, semiconductor memory) storing one or more such programs in machine-readable form. The description is not intended to limit the invention.

What is claimed is:

1. A level sensor for a lithographic projection apparatus, said sensor comprising:
   a light source configured to direct light onto a substrate to be measured;
   a detector configured to detect light reflected from the substrate; and
   a processor configured to calculate a difference between measurements made when the light has a first property and measurements made when the light has a second property different from the first property,
   wherein the level sensor is configured to determine whether said difference is indicative of level sensor process dependency for measurements performed when the light has a third property that is different from at least one of the first and second properties;
   wherein the level sensor is adjustable between a first configuration in which the light has the first property and a second configuration in which the light has the second property.

2. A level sensor according to claim 1, wherein the first property of the light is a first polarization, the second property of the light is a second polarization that is different from the first polarization, the level sensor further comprising a polarizer which in the first configuration applies the first polarization to the light and in the second configuration applies the second polarization to the light.

3. A level sensor according to claim 2, wherein the first polarization is S-polarization, and the second polarization is P-polarization.

4. A level sensor according to claim 2, wherein the polarizer comprises a transmissive plate.

5. A level sensor according to claim 2, wherein the polarizer comprises a polarizing beam splitter cube.

6. A level sensor according to claim 2, wherein selection of the configuration of the polarizer is automated.

7. A level sensor according to claim 1, wherein the first property of the light is polarization, the second property of the light is an unpolarized state, the level sensor further comprising a polarizer which in the first configuration applies a polarization to the light and in the second configuration applies no polarization to the light.

8. A level sensor according to claim 1, wherein the level sensor further comprises a wavelength filter.

9. A level sensor according to claim 8, wherein selection of a configuration of the wavelength filter is automated.

10. A level sensor according to claim 1, further comprising a plurality of sources, each of said plurality of sources being configured to provide light at different wavelengths to be directed onto the substrate.

11. A level sensor according to claim 1, wherein the level sensor is provided with a memory configured to store a plurality of height maps, each of the plurality of height maps corresponding to at least a portion of the substrate.

12. The level sensor according to claim 11, wherein each of the plurality of height maps corresponds to at least one die of the substrate.

13. A level sensor according to claim 11, wherein the difference calculated by the level sensor is based on a height map made with light having the first property and a height map made with light having the second property.

14. A lithographic projection apparatus comprising:
a radiation system configured to provide a beam of radiation;
a support structure configured to support a patterning structure, the patterning structure serving to pattern the beam of radiation according to a desired pattern;
a substrate table configured to hold a substrate;
a projection system configured to project the patterned beam onto a target portion of the substrate;
a level sensor comprising:
a light source configured to direct light onto the substrate,
a detector configured to detect light reflected from the substrate, and
a filter adjustable between a first configuration in which the light is given a first property and a second configuration in which the light is given a second property different from the first property, and
a processor configured to calculate a difference between measurements made with the filter in the first configuration and in the second configuration, wherein the level sensor is configured to determine whether said difference is indicative of level sensor process dependency for measurements performed when the light has a third property that is different from at least one of the first and second properties.

15. A lithographic projection apparatus according to claim 14, wherein the filter comprises a polarizer.

16. A lithographic projection apparatus according to claim 14, further comprising a memory arranged to store a plurality of height maps, each of the plurality of height maps corresponding to at least a portion of the substrate.

17. The apparatus according to claim 16, wherein each of the plurality of height maps corresponds to at least one die of the substrate.

18. A lithographic projection apparatus according to claim 16, wherein the difference is calculated using a height map made with the filter in the first configuration and a height map made with the filter in the second configuration.

19. A method of monitoring the performance of an optical level sensor comprising:
directing a beam of light at a substrate;
detecting a position of the beam of light when it is reflected from the substrate;
measuring the height of the substrate based on a result of said detecting;
prior to said detecting, filtering the light with a filter;
wherein said measuring comprises measuring a height of the substrate with the filter in a first configuration and subsequently measuring a height of the substrate with the filter in a second configuration different from the first configuration, and
wherein said method comprises determining a difference between the measured heights of the substrate; and
determining whether there is a process dependency of the optical level sensor based on the difference between the measured heights.

20. A method according to claim 19, wherein the filter comprises a polarizer, the first configuration of the filter applying a first polarization to the light, and the second configuration of the filter applying a second polarization different than the first polarization to the light.

21. A method according to claim 20, wherein the first polarization is S-polarization, and the second polarization is P-polarization.

22. A method according to claim 19, wherein the filter comprises a polarizer, the first configuration of the filter applying a polarization to the light, and the second configuration of the filter applying no polarization to the light.

23. A method according to claim 19, said method comprising comparing a difference between the measured heights with a threshold.

24. A method according to claim 19, wherein the measuring comprises determining a height map of the substrate with the filter in the first configuration and a height map of the substrate with the filter in the second configuration.

25. A method according to claim 24, wherein the height map comprises a map of the substrate.

26. A method according to claim 24, wherein the height map comprises an average map of a die of the substrate.

27. A method according to claim 26, said method comprising excluding, based upon the map of the die of the substrate, one or more selected areas from leveling measurements used during exposure of the substrate.

28. A method according to claim 24, said method comprising performing additional height measurements using an air-gauge, the number and location of the measurements being based upon the height map.

29. A level sensor comprising:
a light source configured to direct a light beam onto a surface of a substrate;
a detector configured to detect a reflection of the light beam from the surface of said substrate; and
a processor configured to determine a position of said substrate based on a first detection of a reflection of the light beam from the surface of said substrate and a second detection of a reflection of the light beam from the surface of said substrate,
wherein a polarization of the light beam in the first detection differs from a polarization of the light beam in the second detection,
and wherein the level sensor is configured to determine whether a difference between a result of the first detection and a result of the second detection is indicative of a level sensor process dependency for measurements performed when the light has a property that is different from a property of light in at least one of the first and second detections.

30. The level sensor according to claim 29, wherein the polarization state of the light beam in one of the first and second detections is one among the group consisting of a S-polarization and a P-polarization.

31. The level sensor according to claim 29, wherein said processor is configured to determine the position based on a difference between a result of the first detection and a result of the second detection.

32. The level sensor according to claim 29, said sensor comprising a polarizer having a first configuration during the first detection and a second configuration during the second detection.

33. The level sensor according to claim 29, wherein said light source includes a first light source and a second light source, wherein the first light source is configured to direct light of a first wavelength onto the surface of the substrate, and wherein the second light source is configured to direct light of a second wavelength different from the first wavelength onto the surface of the substrate.

34. The level sensor according to claim 29, wherein the processor is configured to determine a height map of a surface of at least a portion of the substrate based on the first and second detections.

* * * * *